(12) United States Patent
Lee et al.

(10) Patent No.: US 10,032,494 B2
(45) Date of Patent: Jul. 24, 2018

(54) DATA PROCESSING SYSTEMS AND A PLURALITY OF MEMORY MODULES

(71) Applicant: SK hynix Inc., Icheon-si, Gyeonggi-do (KR)

(72) Inventors: Sung Eun Lee, Icheon-si Gyeonggi-do (KR); Jung Hyun Kwon, Seoul (KR); Jae Sun Lee, Seoul (KR); Jingzhe Xu, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/492,182

(22) Filed: Apr. 20, 2017

(65) Prior Publication Data
US 2018/0019007 A1    Jan. 18, 2018

(30) Foreign Application Priority Data

Jul. 14, 2016 (KR) .................. 10-2016-0089127

(51) Int. Cl.
*G11C 7/18* (2006.01)
*G11C 7/10* (2006.01)
*G06F 13/16* (2006.01)
*G11C 11/406* (2006.01)

(52) U.S. Cl.
CPC ........ *G11C 7/1072* (2013.01); *G06F 13/1663* (2013.01); *G06F 13/1673* (2013.01); *G06F 13/1684* (2013.01); *G11C 7/1075* (2013.01); *G11C 11/40607* (2013.01)

(58) Field of Classification Search
CPC ............... G11C 7/1072; G11C 7/1075; G11C 11/40607; G06F 13/1663; G06F 13/1673; G06F 13/1684
See application file for complete search history.

(56) References Cited

U.S. PATENT DOCUMENTS

| | | | | |
|---|---|---|---|---|
| 7,486,104 | B2* | 2/2009 | Oh ...................... | G06F 13/4086 326/26 |
| 7,558,150 | B2* | 7/2009 | Shaeffer .............. | G06F 13/1689 365/191 |
| 7,716,411 | B2 | 5/2010 | Panabaker et al. | |
| 8,687,451 | B2* | 4/2014 | Wang .................. | G11C 11/4072 365/189.05 |
| 9,653,184 | B2* | 5/2017 | Frayer ................... | G11C 29/44 |

FOREIGN PATENT DOCUMENTS

KR    1020130043474 A    4/2013

* cited by examiner

*Primary Examiner* — Pho M Luu
(74) *Attorney, Agent, or Firm* — William Park & Associates Ltd.

(57) ABSTRACT

A data processing system may include a memory/storage circuit and a host. The memory/storage circuit may include a first memory module and a second memory module. Each of the first and second memory modules may include a controller and a memory device. The host may have access to the memory device of the first memory module and the memory device of the second memory module. Each of the controllers included in the first and second memory modules may be configured to selectively perform any one of a memory operation and a storage operation according to a request of the host.

17 Claims, 5 Drawing Sheets

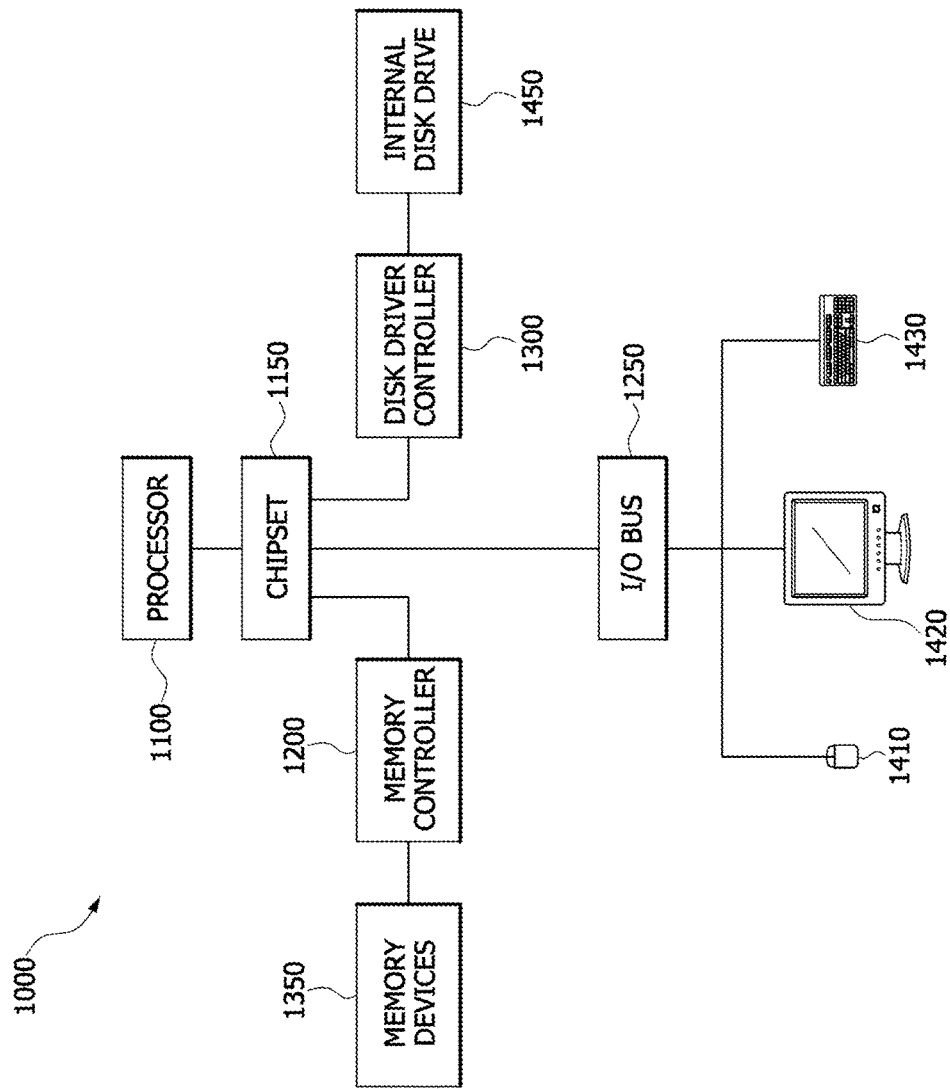

DATA PROCESSING SYSTEMS AND A PLURALITY OF MEMORY MODULES

CROSS-REFERENCE TO RELATED APPLICATIONS

The present application claims priority under 35 U.S.C. 119(a) to Korean Application No. 10-2016-0089127, filed on Jul. 14, 2016, which is herein incorporated by reference in its entirety.

BACKGROUND

1. Technical Field

Various embodiments of the present disclosure may generally relate to data processing systems and, more particularly, to data processing systems relating to memory modules.

2. Related Art

Semiconductor memory devices may be categorized as either volatile memory devices or nonvolatile memory devices. This categorization depends on whether data can be retained without a power supply. As the semiconductor memory devices become smaller and more highly integrated, dynamic random access memory (DRAM) devices among the volatile memory devices and NAND flash memory devices among the nonvolatile memory devices have been widely used. In general, the nonvolatile memory devices may be used as storage media for storing data.

The DRAM devices have to be designed to perform a power-down operation and a refresh operation because of the nature of memory cells. For example, the DRAM devices may operate in a power-down mode to reduce power consumption while the DRAM devices are put into an idle state and may operate in a refresh mode to prevent data stored in cell capacitors of memory cells from being lost due to a leakage current characteristic of the cell capacitors.

The NAND flash memory devices do not provide and support an overwrite function unlike hard disk drives. Thus, the NAND flash memory devices have to perform an erasure-before-write operation in unit of blocks and have to perform a background operation according to their inherent characteristic. In general, the background operation may include a garbage collection operation (e.g., a merging operation, a compaction operation or the like) for efficiently processing valid pages and invalid pages of the NAND flash memory devices and a wear-leveling operation for equalizing wear-levels of memory cells of the NAND flash memory devices.

As described above, since the DRAM device and the NAND flash memory device perform different operations due to their own characteristics, a data processing system including both the DRAM device and the NAND flash memory device has to employ different memory modules and different interfaces to complete these different operations.

SUMMARY

According to an embodiment, a data processing system may include a memory and storage (memory/storage) circuit and a host. The memory/storage circuit may include a first memory module and a second memory module. Each of the first and second memory modules may include a controller and a memory device. The host may have access to the memory device of the first memory module and the memory device of the second memory module. Each of the controllers included in the first and second memory modules may be configured to selectively perform any one of a memory operation and a storage operation according to a request of the host.

According to an embodiment, a data processing system may include a memory/storage circuit and a host. The memory/storage circuit may include a first memory module group and a second memory module group. Each of the first and second memory module groups may include a plurality of memory modules, and each of the memory modules may include a controller and a memory device. The host may be configured to access to the memory device of at least one of the memory modules included in the first and second memory module groups. Each of the controllers included in the first and second memory module groups may be configured to selectively perform any one of a memory operation and a storage operation according to a request of the host.

BRIEF DESCRIPTION OF THE DRAWINGS

FIG. 5 illustrates a block diagram of an example of a representation of a system employing a data processing system with the various embodiments discussed above with relation to FIGS. 1-4.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present there between. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element there between.

Various embodiments may be directed to data processing systems including a plurality of memory modules.

Figure 1:
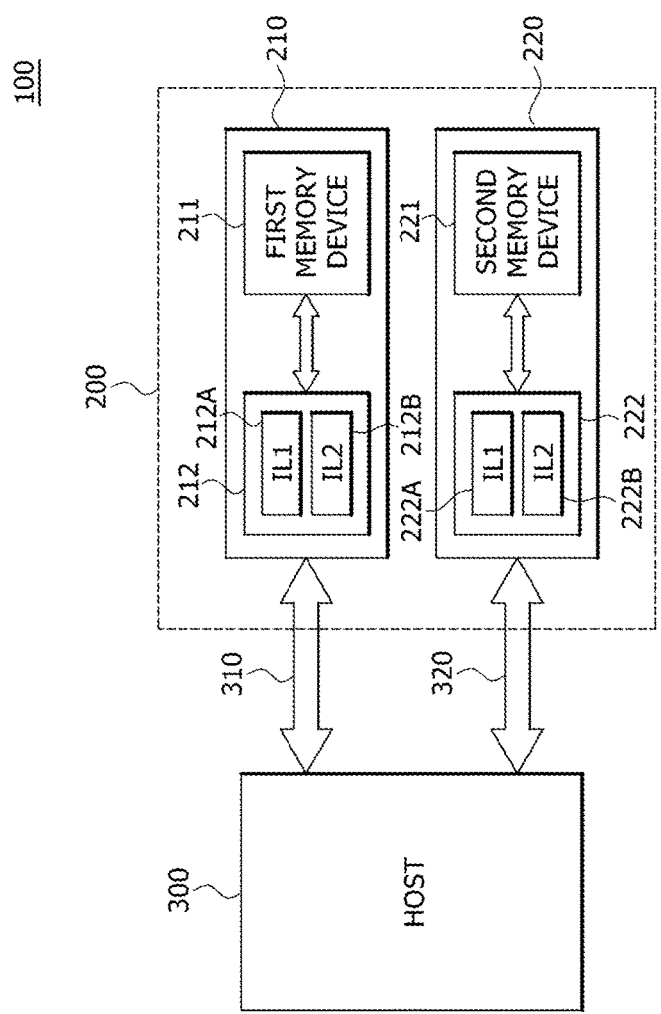
FIG. 1 is a block diagram illustrating a representation of an example of a data processing system according to an embodiment.

FIG. 1 is a block diagram illustrating a data processing system 100 according to an embodiment. Referring to FIG. 1, the data processing system 100 may include a memory/ storage circuit 200 and a host 300. The memory/storage circuit 200 may include a first memory module 210 and a second memory module 220. Each of the first and second memory modules 210 and 220 may be configured to selectively perform any one of a memory operation and a storage operation according to a request of the host 300. In general, the memory operation may be defined as an operation which is performed to temporarily store programs and data into a volatile memory device such as a DRAM device, and the storage operation may be defined as an operation which is performed to store data into a nonvolatile memory device such as a NAND flash memory device or a storage device such as a hard disk drive. However, in the present disclosure, the memory operation may include an operation which is performed to store the programs and the data into a nonvolatile memory device such as a phase change RAM (PCRAM) device. Data transmission between the host 300 and the first memory module 210 may be achieved using a first data bus 310. Data transmission between the host 300 and the second memory module 220 may be achieved using a second data bus 320.

The first and second memory modules 210 and 220 may be realized to have the same structure and configuration. For example, each of the first and second memory modules 210 and 220 may be realized to include a controller and a memory device which are integrated on the same substrate. In such a case, the memory device may be a PCRAM device, a magneto-resistive RAM (MRAM) device, a nano floating gate memory (NFGM) device, a resistive RAM (RRAM) device or a polymer RAM device.

The first memory module 210 may include a first memory device 211 and a first controller 212. The first memory device 211 may be realized to include a single memory chip or a plurality of memory chips which are integrated on a substrate. The first controller 212 may include a first interface logic circuit (IL1) 212A and a second interface logic circuit (IL2) 2128. The first memory device 211 may communicate with the host 300 through the first and second interface logic circuits (IL1, IL2) 212A and 2128 of the first controller 212. The first interface logic circuit (IL1) 212A may be connected to the first memory device 211 and may be configured to perform the memory operation of the first memory device 211. The second interface logic circuit (IL2) 2128 may be connected to the first memory device 211 and may be configured to perform the storage operation of the first memory device 211.

The second memory module 220 may include a second memory device 221 and a second controller 222. The second controller 222 may include a first interface logic circuit (IL1) 222A and a second interface logic circuit (IL2) 222B. The second memory device 221 may communicate with the host 300 through the first and second interface logic circuits (IL1, IL2) 222A and 222B of the second controller 222. The first and second memory modules 210 and 220 may have substantially the same structure and the same configuration. That is, the second memory device 221 may have the same configuration as the first memory device 211, and the second controller 222 may also have the same configuration as the first controller 212. Accordingly, in a present embodiment, the first and second memory modules 210 and 220 may be replaced with each other. In a present embodiment, the first and second memory modules 210 and 220 may be interchangeable with each other.

The first memory device 211 of the first memory module 210 may be a nonvolatile memory device having a relatively low latency to selectively perform any one of the memory operation and the storage operation according to a request of the host 300. Similarly, the second memory device 221 of the first memory module 220 may also be a nonvolatile memory device having a relatively low latency to selectively perform any one of the memory operation and the storage operation according to a request of the host 300. As described above, each of the first and second memory devices 211 and 221 may be a PCRAM device, an MRAM device, an NFGM device, an RRAM device or a polymer RAM device.

The host 300 may access to the first memory device 211 of the first memory module 210 through the first controller 212 and may access to the second memory device 221 of the second memory module 220 through the second controller 222. In an embodiment, if the memory operation is required, the host 300 may access to the first memory device 211 of the first memory module 210. In an embodiment, if the storage operation is required, the host 300 may access to the second memory device 221 of the second memory module 220.

For example, if the memory operation is required, the host 300 may transmit a first read command or a first write command to the first controller 212 of the first memory module 210 through the first data bus 310. The host 300 may additionally transmit various commands necessary for the memory operation to the first controller 212. In some embodiments, the various commands necessary for the memory operation may include a power-down command or a refresh command. In such a case, the first interface logic circuit 212A of the first controller 212 may control operations of the first memory device 211, and the second interface logic circuit 212B of the first controller 212 may stop controlling the operations of the first memory device 211. That is, a set value for activating the first interface logic circuit 212A and for inactivating the second interface logic circuit 212B may be stored in a register (not illustrated) of the first controller 212. The set value may be stored in the register (not illustrated) of the first controller 212 by the host 300 when the data processing system 100 is booted up.

If the storage operation is required, the host 300 may transmit a second read command (or a second write command) and address information to the second controller 222 of the second memory module 220 through the second data bus 320. In such a case, the second interface logic circuit 222B of the second controller 222 may control operations of the second memory device 221, and the first interface logic circuit 222A of the second controller 222 may stop controlling the operations of the second memory device 221. That is, a set value for activating the second interface logic circuit 222B and for inactivating the first interface logic circuit 222A may be stored in a register (not illustrated) of the second controller 222. The set value may be stored in the register (not illustrated) of the second controller 222 by the host 300 when the data processing system 100 is booted up.

In some other embodiments, both of the first and second memory modules 210 and 220 may perform the memory operation or the storage operation. For example, in order that both of the first and second memory modules 210 and 220 perform the memory operation, the first interface logic circuit 212A of the first controller 212 and the first interface logic circuit 222A of the second controller 222 may be activated and the second interface logic circuit 212B of the first controller 212 and the second interface logic circuit 222B of the second controller 222 may be inactivated. In order that both of the first and second memory modules 210 and 220 perform the storage operation, the second interface logic circuit 212B of the first controller 212 and the second interface logic circuit 222B of the second controller 222 may be activated and the first interface logic circuit 212A of the first controller 212 and the first interface logic circuit 222A of the second controller 222 may be inactivated.

Figure 2:
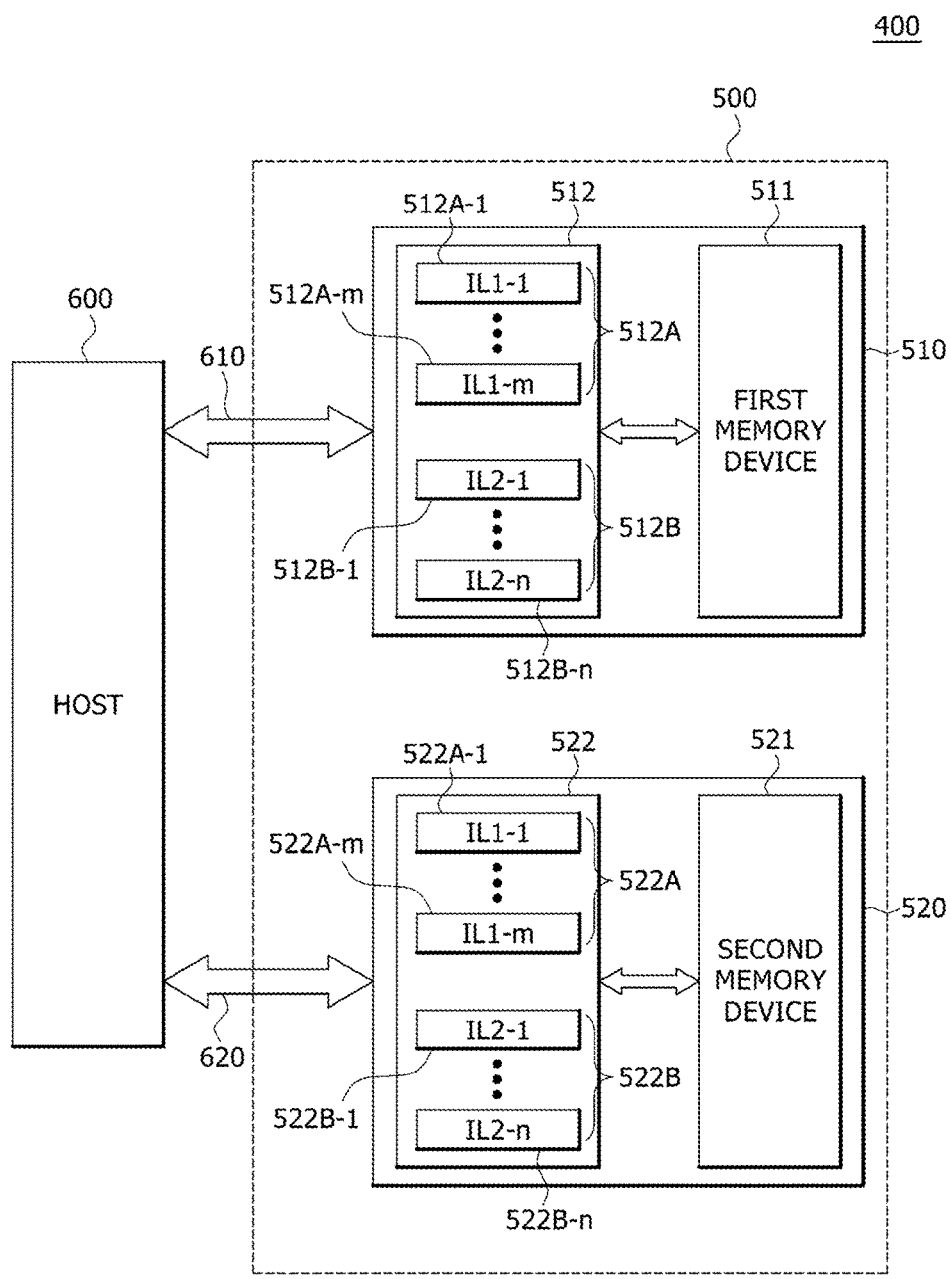
FIG. 2 is a block diagram illustrating a representation of an example of a data processing system according to an embodiment.

FIG. 2 is a block diagram illustrating a data processing system 400 according to an embodiment. Referring to FIG. 2, the data processing system 400 may include a memory/storage circuit 500 and a host 600. The memory/storage circuit 500 may include a first memory module 510 and a second memory module 520. Each of the first and second memory modules 510 and 520 may be configured to selectively perform any one of the memory operation and the storage operation according to a request of the host 600. Data transmission between the host 600 and the first memory module 510 may be achieved using a first data bus 610. Data transmission between the host 600 and the second memory module 520 may be achieved using a second data bus 620.

The first and second memory modules 510 and 520 may be realized to have the same structure and configuration. For example, each of the first and second memory modules 510 and 520 may be realized to include a controller and a memory device which are integrated on the same substrate. The first memory module 510 may include a first memory device 511 and a first controller 512. The first memory device 511 may be realized to include a single memory chip or a plurality of memory chips which are integrated on a substrate. The first controller 512 may include a first interface logic group 512A and a second interface logic group 512B. The first interface logic group 512A may include a plurality of first interface logic circuits, for example, "m"-number of first interface logic circuits (IL1-1, . . . , and IL1-m) 512A-1, . . . , and 512A-m (wherein, "m" is a natural number which is equal to or greater than two). The first memory device 511 may communicate with the host 600 through the first and second interface logic groups 512A and 512B of the first controller 512. The first interface logic circuits (IL1-1, . . . , and IL1-m) 512A-1, . . . , and 512A-m may be connected to the first memory device 511 and may be configured to perform the memory operation of the first memory device 511. The first interface logic circuits 512A-1, . . . , and 512A-m may be configured to perform the memory operation of the first memory device 511 according to memory specifications of the first memory device 511. In some embodiments, each of the memory specifications of the first memory device 511 may include a RAM timing, an operation clock, a memory bus width, a channel scheme, a latency, and a serial/parallel transmission scheme. The second interface logic group 512B may include a plurality of second interface logic circuits, for example, "n"-number of second interface logic circuits (IL2-1, . . . , and IL2-n) 512B-1, . . . , and 512B-n (wherein, "n" is a natural number which is equal to or greater than two). The second interface logic circuits 512B-1, . . . , and 512B-n may be connected to the first memory device 511 and may be configured to perform the storage operation of the first memory device 511. The second interface logic circuits 512B-1, . . . , and 512B-n may be configured to perform the storage operation of the first memory device 511 according to storage specifications of the first memory device 511.

The second memory module 520 may include a second memory device 521 and a second controller 522. The second controller 522 may include a first interface logic group 522A and a second interface logic group 522B. The first interface logic group 522A may include a plurality of first interface logic circuits, for example, "m"-number of first interface logic circuits (IL1-1, . . . , and IL1-m) 522A-1, . . . , and 522A-m. The second interface logic group 522B may include a plurality of second interface logic circuits, for example, "n"-number of second interface logic circuits (IL2-1, . . . , and IL2-n) 522B-1, . . . , and 522B-n. The first and second memory modules 510 and 520 may have substantially the same structure and configuration. That is, the second memory device 521 may have the same configuration as the first memory device 511, and the second controller 522 may also have the same configuration as the first controller 512. Accordingly, in a present embodiment, the first and second memory modules 510 and 520 may be replaced with each other. Each of the first and second memory devices 511 and 521 may be a PCRAM device, an MRAM device, an NFGM device, an RRAM device or a polymer RAM device. In a present embodiment, the first and second memory modules 510 and 520 may be interchangeable with each other.

The host 600 may access to the first memory device 511 of the first memory module 510 through the first controller 512 and may access to the second memory device 521 of the second memory module 520 through the second controller 522. In an embodiment, if the memory operation is required, the host 600 may access to the first memory device 511 of the first memory module 510. In an embodiment, if the storage operation is required, the host 600 may access to the second memory device 521 of the second memory module 520.

For example, if the memory operation is required, the host 600 may transmit a first read command or a first write command to the first controller 512 of the first memory module 510 through the first data bus 610. The host 600 may additionally transmit various commands necessary for the memory operation to the first controller 512. In some embodiments, the various commands necessary for the memory operation may include a power-down command or a refresh command. In such a case, any one selected from the first interface logic circuits 512A-1, . . . , and 512A-m constituting the first interface logic group 512A of the first controller 512 may control operations of the first memory device 511, and all of the second interface logic circuits 512B-1, . . . , and 512B-n constituting the second interface logic group 512B of the first controller 512 may stop controlling the operations of the first memory device 511. That is, a set value for activating any one selected from the first interface logic circuits 512A-1, . . . , and 512A-m and for inactivating the remaining non-selected first interface logic circuits and all of the second interface logic circuits 512B-1, . . . , and 512B-n may be stored in a register (not illustrated) of the first controller 512. The set value may be stored in the register (not illustrated) of the first controller 512 by the host 600 when the data processing system 400 is booted up.

If the storage operation is required, the host 600 may transmit a second read command (or a second write command) and address information to the second controller 522 of the second memory module 520 through the second data bus 620. In such a case, any one selected from the second interface logic circuits 522B-1, . . . , and 522B-n constituting the second interface logic group 522B of the second controller 522 may control operations of the second memory device 521, and all of the first interface logic circuits 522A-1, . . . , and 522A-m constituting the first interface logic group 522A of the second controller 522 may stop controlling the operations of the second memory device 521. That is, a set value for activating any one selected from the second interface logic circuits 522B-1, . . . , and 522B-n and for inactivating the remaining non-selected second interface logic circuits and all of the first interface logic circuits 522A-1, . . . , and 522A-m may be stored in a register (not illustrated) of the second controller 522. The set value may be stored in the register (not illustrated) of the second controller 522 by the host 600 when the data processing system 400 is booted up.

In some other embodiments, both of the first and second memory modules 510 and 520 may perform the memory operation or the storage operation. In order that both of the first and second memory modules 510 and 520 perform the memory operation, any one selected from the first interface logic circuits 512A-1, . . . , and 512A-m constituting the first interface logic group 512A of the first controller 512 and any one selected from the first interface logic circuits 522A-1, . . . , and 522A-m constituting the first interface logic group 522A of the second controller 522 may be activated. In such a case, the remaining non-selected first interface logic circuits of the first controller 512, all of the second interface logic circuits 512B-1, . . . , and 512B-n of the first controller 512, the remaining non-selected first interface logic circuits of the second controller 522, and all of the second interface logic circuits 522B-1, . . . , and 522B-n of the second controller 522 may be inactivated. The first interface logic circuit selected and activated in the first controller 512 and the first interface logic circuit selected and activated in the second controller 522 may be configured to operate based on the same memory specification. In such a case, the first and second memory modules 510 and 520 may have the same memory specification. Alternatively, the first interface logic circuit selected and activated in the first controller 512 and the first interface logic circuit selected and activated in the second controller 522 may be configured to operate based on different memory specifications. In such a case, the first and second memory modules 510 and 520 may have different memory specifications.

In order that both of the first and second memory modules 510 and 520 perform the storage operation, any one selected from the second interface logic circuits 512B-1, . . . , and 512B-n constituting the second interface logic group 512B of the first controller 512 and any one selected from the second interface logic circuits 522B-1, . . . , and 522B-n constituting the second interface logic group 522B of the second controller 522 may be activated. In such a case, the remaining non-selected second interface logic circuits of the first controller 512, all of the first interface logic circuits 512A-1, . . . , and 512A-m of the first controller 512, the remaining non-selected second interface logic circuits of the second controller 522, and all of the first interface logic circuits 522A-1, . . . , and 522A-m of the second controller 522 may be inactivated. The second interface logic circuit selected and activated in the first controller 512 and the second interface logic circuit selected and activated in the second controller 522 may be configured to operate based on the same storage specification. In such a case, the first and second memory modules 510 and 520 may have the same storage specification. Alternatively, the first interface logic circuit selected and activated in the first controller 512 and the first interface logic circuit selected and activated in the second controller 522 may be configured to operate based on different storage specifications. In such a case, the first and second memory modules 510 and 520 may have different storage specifications.

Figure 3:
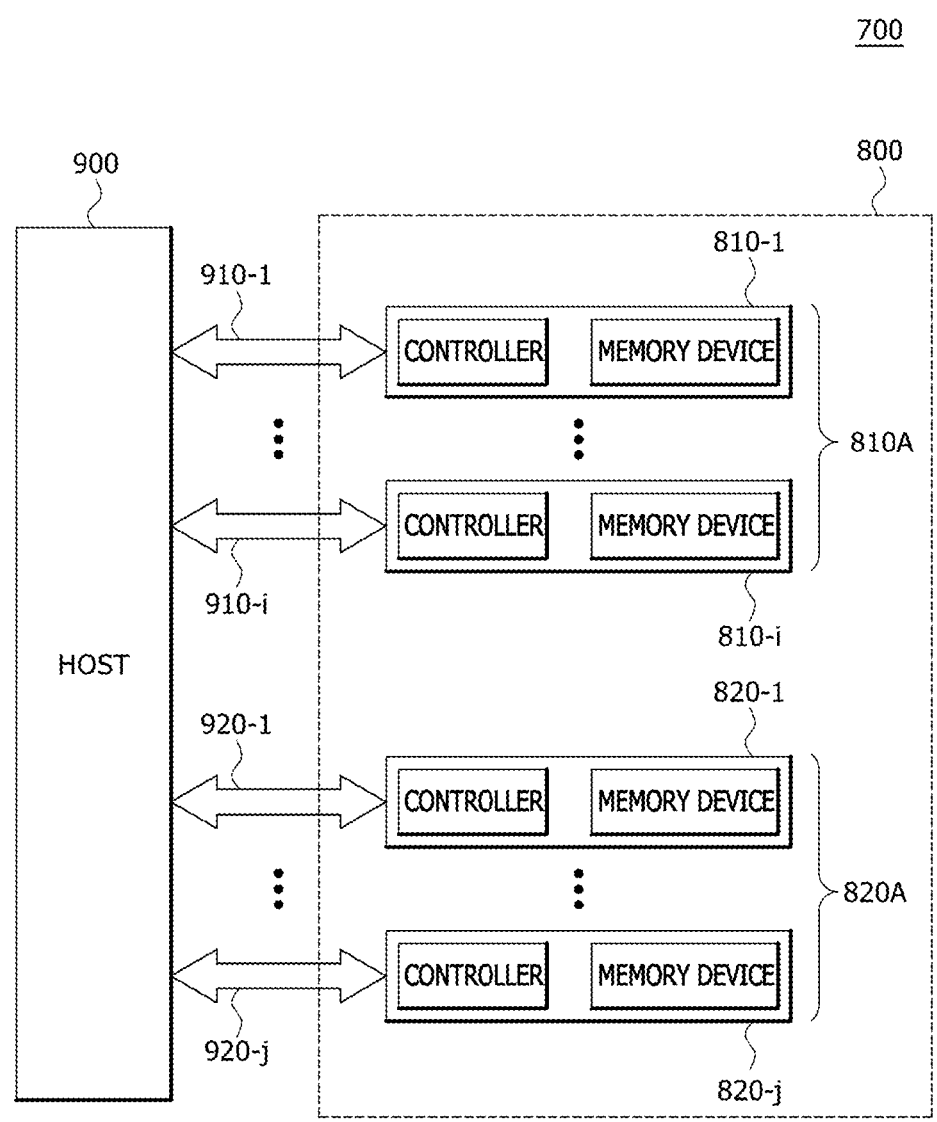
FIG. 3 is a block diagram illustrating a representation of an example of a data processing system according to an embodiment.
Figure 4:
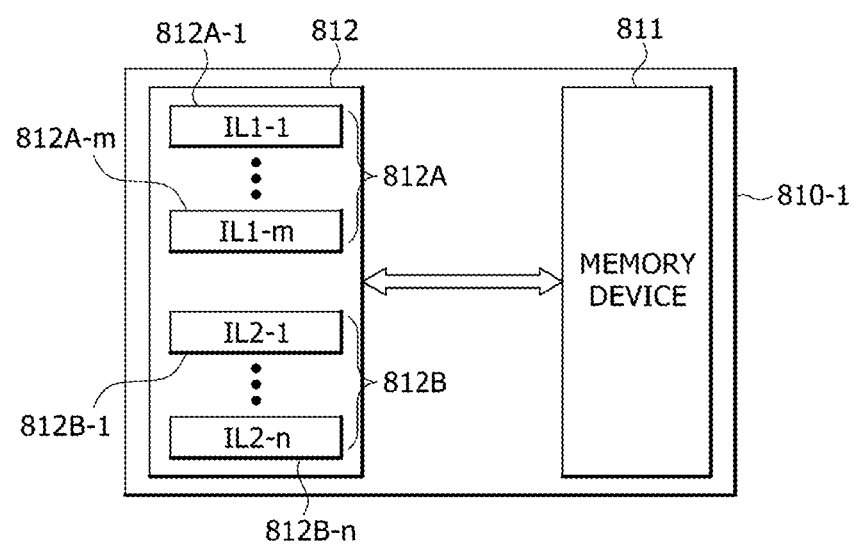
FIG. 4 is a block diagram illustrating a representation of an example of any one of memory modules included in the data processing system illustrated in FIG. 3.

FIG. 3 is a block diagram illustrating a data processing system 700 according to an embodiment, and FIG. 4 is a block diagram illustrating any one of memory modules included in the data processing system 700 illustrated in FIG. 3. Referring to FIGS. 3 and 4, the data processing system 700 may include a memory/storage circuit 800 and a host 900. The memory/storage circuit 800 may include a first memory module group 810A and a second memory module group 820A. The first memory module group 810A may include a plurality of first memory modules, for example, "i"-number of first memory modules 810-1, . . . , and 810-i. The second memory module group 820A may include a plurality of second memory modules, for example, "j"-number of second memory modules 820-1, . . . , and 820-j. Each of the first memory modules 810-1, . . . , and 810-i and the second memory modules 820-1, . . . , and 820-j may be configured to selectively perform any one of the memory operation and the storage operation according to a request of the host 900. In some embodiments, the first memory modules 810-1, . . . , and 810-i constituting the first memory module group 810A may perform the memory operation, and the second memory modules 820-1, . . . , and 820-j constituting the second memory module group 820A may perform the storage operation.

The host 900 may receive data from the first memory modules 810-1, . . . , and 810-i through first data buses 910-1, . . . , and 910-i or may output the data to the first memory modules 810-1, . . . , and 810-i through the first data buses 910-1, . . . , and 910-i. The number of the first memory modules 810-1, . . . , and 810-i may be equal to the number of the first data buses 910-1, . . . , and 910-i. In some embodiments, the data transmission between the host 900 and the first memory module 810-1 may be achieved using the first data bus 910-1, and the data transmission between the host 900 and the first memory module 810-i may be achieved using the first data bus 910-i. The host 900 may receive data from the second memory modules 820-1, . . . , and 820-j through second data buses 920-1, . . . , and 920-j or may output the data to the second memory modules 820-1, . . . , and 820-j through the second data buses 920-1, . . . , and 920-j. The number of the second memory modules 820-1, . . . , and 820-j may be equal to the number of the second data buses 920-1, . . . , and 920-j. In some embodiments, the data transmission between the host 900 and the second memory module 820-1 may be achieved using the second data bus 920-1, and the data transmission between the host 900 and the second memory module 820-j may be achieved using the second data bus 920-j.

Each of the first memory modules 810-1, . . . , and 810-i may be configured to include a controller and a memory device which are integrated on a substrate, and each of the second memory modules 820-1, . . . , and 820-j may also be configured to include a controller and a memory device which are integrated on a substrate. In addition, the first memory modules 810-1, . . . , and 810-i and the second memory modules 820-1, . . . , and 820-j may have the same configuration. That is, each of the first memory modules 810-2, . . . , and 810-i and the second memory modules 820-1, . . . , and 820-j may have the same configuration as the first memory module 810-1 illustrated in FIG. 4. As illustrated in FIG. 4, the first memory module 810-1 of the first memory module group 810A may include a memory device 811 and a controller 812. The memory device 811 may be realized to include a single memory chip or a plurality of memory chips which are integrated on a substrate. The memory device 811 may be a PCRAM device, an MRAM device, an NFGM device, an RRAM device or a polymer RAM device.

The controller 812 may include a first interface logic group 812A and a second interface logic group 812B. The first interface logic group 812A may include a plurality of first interface logic circuits, for example, "m"-number of first interface logic circuits (IL1-1, . . . , and IL1-m)

812A-1, . . . , and 812A-m. The memory device 811 may communicate with the host 900 through the first and second interface logic groups 812A and 812B of the first controller 812. The first interface logic circuits (IL1-1, . . . , and IL1-$m$) 812A-1, . . . , and 812A-m may be connected to the memory device 811 and may be configured to perform the memory operation of the memory device 811. The first interface logic circuits 812A-1, . . . , and 812A-m may be configured to perform the memory operation of the memory device 811 based on a memory specification of the memory device 811. In some embodiments, the memory specification of the memory device 811 may include a RAM timing, an operation clock, a memory bus width, a channel scheme, a latency, and a serial/parallel transmission scheme. The second interface logic group 812B may include a plurality of second interface logic circuits, for example, "n"-number of second interface logic circuits (IL2-1, . . . , and IL2-$n$) 812B-1, . . . , and 812B-n. The second interface logic circuits 812B-1, . . . , and 812B-n may be connected to the memory device 811 and may be configured to perform the storage operation of the memory device 811. The second interface logic circuits 812B-1, . . . , and 812B-n may be configured to perform the storage operation of the memory device 811 according to a storage specification of the memory device 811.

The host 900 may access to the memory devices 811 of the first memory modules 810-1, . . . , and 810-$i$ constituting the first memory module group 810A or to the memory devices 811 of the second memory modules 820-1, . . . , and 820-$j$ constituting the second memory module group 820A. In an embodiment, if the memory operation is required, the host 900 may access to the memory devices 811 of the first memory modules 810-1, . . . , and 810-$i$. In an embodiment, if the storage operation is required, the host 900 may access to the memory devices 811 of the second memory modules 820-1, . . . , and 820-$j$.

Operations of the data processing system 700 will be described hereinafter. If the memory operation is required, the host 900 may transmit a first read command or a first write command to the controllers 812 of the first memory modules 810-1, . . . , and 810-$i$ through the first data buses 910-1, . . . , and 910-$i$. The host 900 may additionally transmit various commands necessary for the memory operation to the controllers 812. In some embodiments, the various commands necessary for the memory operation may include a power-down command or a refresh command. In such a case, in each of the first memory modules 810-1, . . . , and 810-$i$, any one selected from the first interface logic circuits 812A-1, . . . , and 812A-m constituting the first interface logic group 812A may control an operation of the memory device 811, and all of the second interface logic circuits 812B-1, . . . , and 812B-n constituting the second interface logic group 812B may stop controlling the operation of the memory device 811. That is, a set value for activating any one selected from the first interface logic circuits 812A-1, . . . , and 812A-m constituting the first interface logic group 812A as well as for inactivating the remaining non-selected first interface logic circuits and all of the second interface logic circuits 812B-1, . . . , and 812B-n constituting the second interface logic group 812B may be stored in a register (not illustrated) of the controller 812. The set value may be stored in the register (not illustrated) of the controller 812 by the host 900 when the data processing system 700 is booted up.

If the storage operation is required, the host 900 may transmit a second read command (or a second write command) and address information to the controllers 812 of the second memory modules 820-1, . . . , and 820-$j$ through the second data buses 920-1, . . . , and 920-$j$. In such a case, in each of the second memory modules 820-1, . . . , and 820-$j$, any one selected from the second interface logic circuits 812B-1, . . . , and 812B-n constituting the second interface logic group 812B may control an operation of the memory device 811, and all of the first interface logic circuits 812A-1, . . . , and 812A-m constituting the first interface logic group 812A may stop controlling the operation of the memory device 811. That is, a set value for activating any one selected from the second interface logic circuits 812B-1, . . . , and 812B-n constituting the second interface logic group 812B as well as for inactivating the remaining non-selected second interface logic circuits and all of the first interface logic circuits 812A-1, . . . , and 812A-m constituting the first interface logic group 812A may be stored in a register (not illustrated) of the controller 812. The set value may be stored in the register (not illustrated) of the controller 812 by the host 900 when the data processing system 700 is booted up.

In the data processing system 700, some of the first memory modules 810-1, . . . , and 810-$i$ constituting the first memory module group 810A may be used as memory units during the memory operation, and the remaining first memory modules may be used as storage units during the storage operation. Similarly, some of the second memory modules 820-1, . . . , and 820-$j$ constituting the second memory module group 820A may be used as memory units during the memory operation, and the remaining second memory modules may be used as storage units during the storage operation. In each of the memory modules used as the memory units, any one of the interface logic circuits may be selectively activated for the memory operation. In each of the memory modules used as the storage units, any one of the interface logic circuits may be selectively activated for the storage operation.

The data processing systems as discussed above (see FIGS. 1-4) are particular useful in the design of other memory devices, processors, and computer systems. For example, referring to FIG. 5, a block diagram of a system employing a data processing system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one data processing system as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one data processing system as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a data processing system as discussed above with relation to FIGS. 1-4. In alternate embodiments, such as, for example but not limited to, cellular phones or digital cameras, the components may differ from the embodiments illustrated in FIG. 5.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A data processing system comprising:
a memory and storage (memory/storage) circuit configured to include a first memory module and a second memory module having substantially the same configurations, wherein each of the first and second memory modules include a controller and a memory device; and
a host configured to access to the memory device of the first memory module and the memory device of the second memory module,
wherein each of the controllers included in the first and second memory modules is configured to selectively perform any one of a memory operation and a storage operation according to a request from the host,
wherein each of the controllers of the first and second memory modules includes:
a first interface logic circuit configured to perform the memory operation of the memory device; and
a second interface logic circuit configured to perform the storage operation of the memory device,
wherein, for the memory operation, the first interface logic circuits of the first and second memory modules are activated and the second interface logic circuits of the first and second memory modules are inactivated, and
wherein, for the storage operation, the second interface logic circuits of the first and second memory modules are activated and the first interface logic circuits of the first and second memory modules are inactivated.

2. The data processing system of claim 1,
wherein the memory operation corresponds to an operation that stores programs and data into the memory device; and
wherein the storage operation corresponds to an operation that stores data into the memory device.

3. The data processing system of claim 2,
wherein the memory operation includes a power-down command or a refresh command.

4. The data processing system of claim 1, wherein each of the memory devices of the first and second memory modules includes at least one of a phase change RAM (PCRAM) device, a magneto-resistive RAM (MRAM) device, a nano floating gate memory (NFGM) device, a resistive RAM (RRAM) device or a polymer RAM device.

5. The data processing system of claim 1, further comprising:
a first data bus coupled between the host and the first memory module; and
a second data bus coupled between the host and the second memory module.

6. The data processing system of claim 1,
wherein, based on the memory operation and storage operation, the first interface logic circuits and second interface logic circuits of the first and second memory modes are either inactivated to stop controlling the operations of the memory devices or activated to allow controlling the operations of the memory devices.

7. The data processing system of claim 1, wherein the controller includes:
a first interface logic group configured to include a plurality of first interface logic circuits that perform the memory operation of the memory device based on a memory specification of the memory device; and
a second interface logic group configured to include a plurality of second interface logic circuits that perform the storage operation of the memory device based on a storage specification of the memory device.

8. The data processing system of claim 7, wherein the memory specification includes a RAM timing, an operation clock, a memory bus width, a channel scheme, a latency, and a serial and parallel (serial/parallel) transmission scheme.

9. A data processing system comprising:
a memory and storage (memory/storage) circuit configured to include a first memory module group and a second memory module group, wherein each of the first and second memory module groups includes a plurality of memory modules having substantially the same configurations and each of the memory modules include a controller and a memory device; and
a host configured to access to the memory device of at least one of the memory modules included in the first and second memory module groups, wherein each of the controllers included in the first and second memory module groups is configured to selectively perform any one of a memory operation and a storage operation according to a request from the host,
wherein each of the controllers of the first and second memory modules includes:
  a first interface logic circuit configured to perform the memory operation of the memory device; and
  a second interface logic circuit configured to perform the storage operation of the memory device,
  wherein, for the memory operation, the first interface logic circuits of the first and second memory modules are activated and the second interface logic circuits of the first and second memory modules are inactivated, and
  wherein, for the storage operation, the second interface logic circuits of the first and second memory modules are activated and the first interface logic circuits of the first and second memory modules are inactivated.

10. The data processing system of claim 9,
wherein the memory operation corresponds to an operation that stores programs and data into the memory device; and
wherein the storage operation corresponds to an operation that stores data into the memory device.

11. The data processing system of claim 9,
wherein the memory operation includes a power-down command or a refresh command.

12. The data processing system of claim 9, wherein each of the memory devices of the first and second memory module groups includes at least one of a phase change RAM (PCRAM) device, a magneto-resistive RAM (MRAM) device, a nano floating gate memory (NFGM) device, a resistive RAM (RRAM) device or a polymer RAM device.

13. The data processing system of claim 9, further comprising:
  a plurality of first data buses coupled between the host and the memory modules included in the first memory module group; and
  a plurality of second data buses coupled between the host and the memory modules included in the second memory module group.

14. The data processing system of claim 13,
wherein the number of first data buses is equal to the number of memory modules included in the first memory module group, and
wherein the number of second data buses is equal to the number of memory modules included in the second memory module group.

15. The data processing system of claim 9,
wherein, based on the memory operation and storage operation, the first interface logic circuits and second interface logic circuits of the first and second memory mode groups are either inactivated to stop controlling the operations of the memory devices or activated to allow controlling the operations of the memory devices.

16. The data processing system of claim 9, wherein each of the controllers includes:
  a first interface logic group configured to include a plurality of first interface logic circuits that perform the memory operation of the memory device based on a memory specification of the memory device; and
  a second interface logic group configured to include a plurality of second interface logic circuits that perform the storage operation of the memory device based on a storage specification of the memory device.

17. The data processing system of claim 16, wherein the memory specification includes a RAM timing, an operation clock, a memory bus width, a channel scheme, a latency, and a serial and parallel (serial/parallel) transmission scheme.

* * * * *